United States Patent [19]
Jackson

[11] Patent Number: 4,736,188
[45] Date of Patent: Apr. 5, 1988

[54] ANALOG TO DIGITAL CONVERTERS

[75] Inventor: Thomas Jackson, Hanwell, England

[73] Assignee: Plessey Overseas Limited, Ilford, England

[21] Appl. No.: 925,634

[22] PCT Filed: Feb. 21, 1986

[86] PCT No.: PCT/GB86/00091
§ 371 Date: Nov. 24, 1986
§ 102(e) Date: Nov. 24, 1986

[87] PCT Pub. No.: WO86/05047
PCT Pub. Date: Aug. 28, 1986

[30] Foreign Application Priority Data
Feb. 23, 1985 [GB] United Kingdom ............... 8504710

[51] Int. Cl.[4] .............................................. H03M 1/12
[52] U.S. Cl. .................................. 340/347 AD; 375/33
[58] Field of Search ................... 340/347 AD; 375/33, 375/30

[56] References Cited
U.S. PATENT DOCUMENTS

| 3,026,375 | 3/1962 | Graham | 375/33 |
| 4,342,983 | 8/1983 | Weigand et al. | 340/347 |
| 4,384,278 | 5/1983 | Benjamin | 340/347 AD |

FOREIGN PATENT DOCUMENTS
1463806 2/1977 United Kingdom .

OTHER PUBLICATIONS
The Bell System Technical Journal, vol. 56, No. 9, Nov. 1977, Netravali; "Optimum Digital Filters for Interpolative A/D Converters", pp. 1629–1641, FIG. 1.
IEEE Transactions on Communications, vol. com-29, No. 6, Jun. 1981, New York, US, Candy et al: "A Voiceband CODEC with Digital Filtering", pp. 815–830.

Primary Examiner—Charles D. Miller
Attorney, Agent, or Firm—Michael F. Oglo; Julian C. Renfro

[57] ABSTRACT

A high resolution analog to digital converter comprising a low resolution analog to digital converter and an interpolating digital to analog converter, the interpolating digital to analog converter having a second order digital controller and a one bit quantiser arranged in a feedback loop. The low resolution analog to digital converter is coupled to a multi-stage decimation filter having an algorithm of any stage thereof determined in dependence upon the algorithm of the immediately preceding stage.

4 Claims, 5 Drawing Sheets

ANALOG TO DIGITAL CONVERTERS

BACKGROUND TO INVENTION

The present invention relates to analogue to digital converters.

A number of different types of analogue to digital (A/D) converters are known. Most of the devices are fairly slow if high precision is required, as for example when 'dual store' or 'ramp' techniques are used. If high speed is required, 'successive approximation' or 'flash' converters are used at the expense of resolution.

Methods used to increase the resolution of the faster converters such as 'sub-ranging' or introducing 'dither' on the input signal have disadvantages. At present the best precision A/D converters available have approximately 14 bits accuracy at a conversion rate of 150 KHz. This means that the ultimate bandwidth of the system is about 50 KHz if aliasing is to be avoided.

Much higher resolutions and speeds are available using a known interpolating feedback system as shown in FIG. 1. Such known interpolating analogue to digital converters usually comprise a relatively coarse resolution analogue to digital (A/D) converter arranged in a feedback loop in combination with a digitial to analogue (D/A) converter; the D/A converter having much finer resolution than the coarse A/D converter. The coarse A/D converter, typically 6 bits resolution, is sampled at a high sample rate, typically 10 MHz, with subsequent averaging of the output samples obtained from the coarse resolution A/D converter.

The quantised signal appearing at the output of the coarse A/D converter is an approximation of the analogue signal fed to it, the approximation being dependent upon the quantum jump or step size of the quantisation and the sample rate used in the quantisation process. At any point in time, the difference between the analogue input signal and the output sample from the coarse A/D converter is known as the quantisation error; generally termed Q.

The output from the coarse A/D converter is fed to the finer resolution D/A converter, the output of which is fed back and combined with the incoming analogue input signal to be digitised. However the D/A converter utilised also gives rise to errors; generally termed T, the resolution of the D/A converter.

Such interpolating A/D converters also include an analogue controller, usually in the form of a high gain amplifier of gain A, in the feed path to the coarse A/D converter.

The digital output of this type of interpolating A/D converter can be expressed as $$D_{OUT} = \frac{V_I A}{1 + A} + \frac{Q}{1 + A} + \frac{TA}{1 + A}$$

where
- $D_{OUT}$ is the digital output signal
- $V_I$ is the analogue input signal
- Q is the quantisation error of the coarse resolution A/D converter
- T is the error in resolution of the D/A converter and
- A is the open loop gain of the analogue controller.

It can be seen from this expression that the term in the quantisation error Q is minimised by maximising the open loop gain A of the analogue controller. However, an increase in the open loop gain A does not improve the linearity of the converter, that is the relationship between the digital output and the analogue input, as the term in the resolution T of the D/A converter remains constant for all but small values of open loop gain A. Furthermore, by maximising the open loop gain A, it becomes extremely difficult to maintain loop stability in the converter. In practice, the resolution of such converters is limited by the value of the term in the quantisation error Q and in modern interpolating A/D converters is usually limited to about 14 bits.

Some disadvantages of the known interpolating feedback systems which have not yet been overcome to date include:

1. The ultimate dynamic range of the A/D converter is limited by the accuracy of the D/A converter used in its feedback path.
2. The complexity of an averaging filter at the output of the A/D converter prohibits the easy realisation of high resolution systems.
3. The design of the system is not optimised such that the clock rates used are usually excessive which results in difficult post processing.

SUMMARY OF THE INVENTION

An objective of the present invention is to provide an interpolating A/D converter which substantially overcomes the above problems and allows an A/D converter in excess of 20 bits linearity to be realised.

According to the present invention there is provided a high resolution analogue to digital converter comprising combiner means for receiving an analogue input signal, an analogue controller means for receiving an output from the combiner means, a low resolution analogue to digital converter for receiving an output from the analogue controller means, an interpolating digital to analogue converter arranged in a feedback loop to the combiner means, the interpolating digital to analogue converter comprising a further combiner means for receiving a digital input, digital controller means for receiving an output from the further combiner means, digital slicer means for receiving an output from the digital controller means and feedback means for affording the output of the digital slicer means to the further combiner means.

Advantageously the digital controller comprises summing means, first delay means connected to the summing means, second delay means connected to the first delay means, further summing means connected to the second delay means, a feedback loop for affording the output of the further summing means to the summing means, and a feed forward loop, including multiplier means, for affording an output from the first delay means to the further summing means.

In one embodiment of the present invention the interpolating digital to analogue converter provides a bit stream having a mark to space ratio proportional to the output word from the low resolution analogue to digital converter, which bit stream is subtractively or additively combined with the analogue input signal.

In a preferred embodiment the low resolution analogue converter is coupled to a multi-stage decimation filter having the algorithm of any stage thereof determined in dependence upon the algorithm of the immediately preceding stage.

The high resolution analogue to digital converter can in one embodiment of the present invention achieve approximately 22 bits resolution at an output sample rate of approximately 300 KHz.

The present invention will be described further, by way of example, with reference to the accompanying drawings in which.

Figure 1:
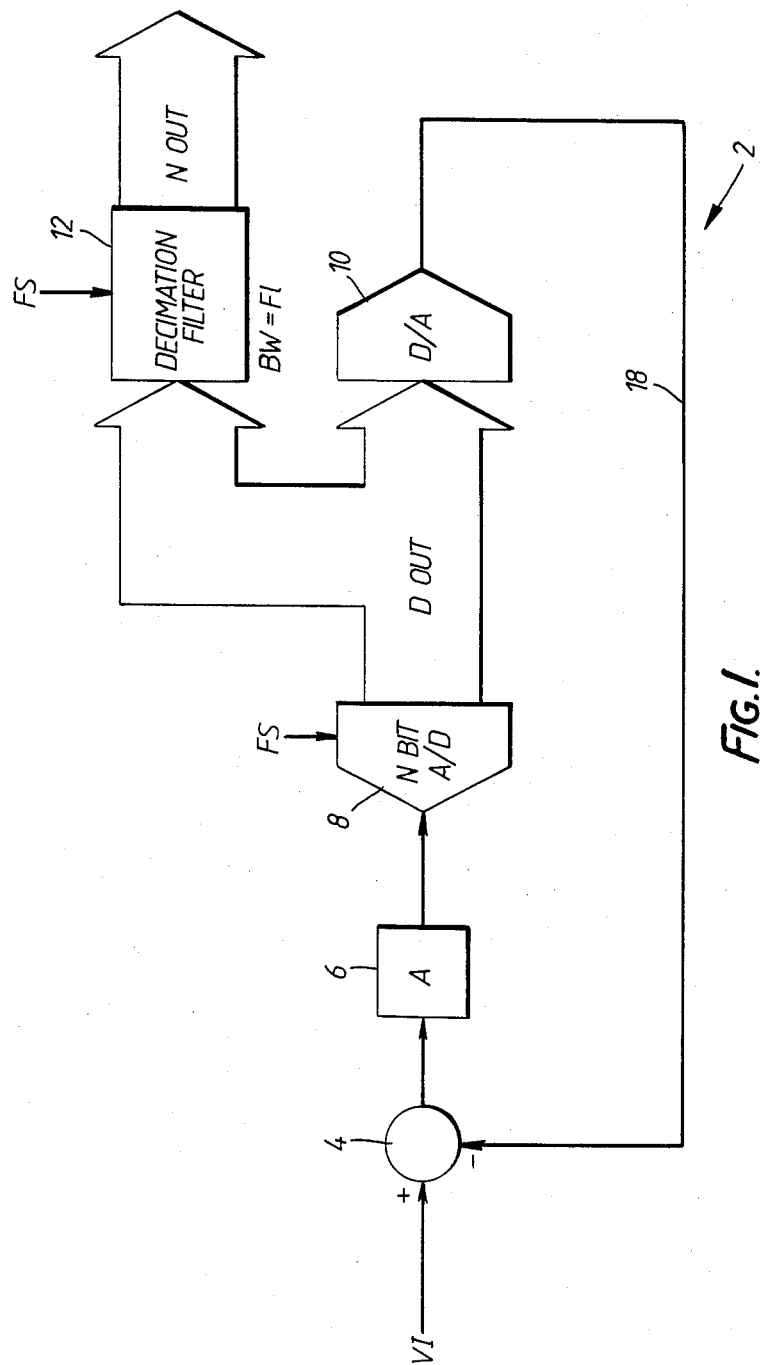
FIG. 1 is a schematic block diagram of an interpolating analogue to digital converter of known construction.
Figure 2:
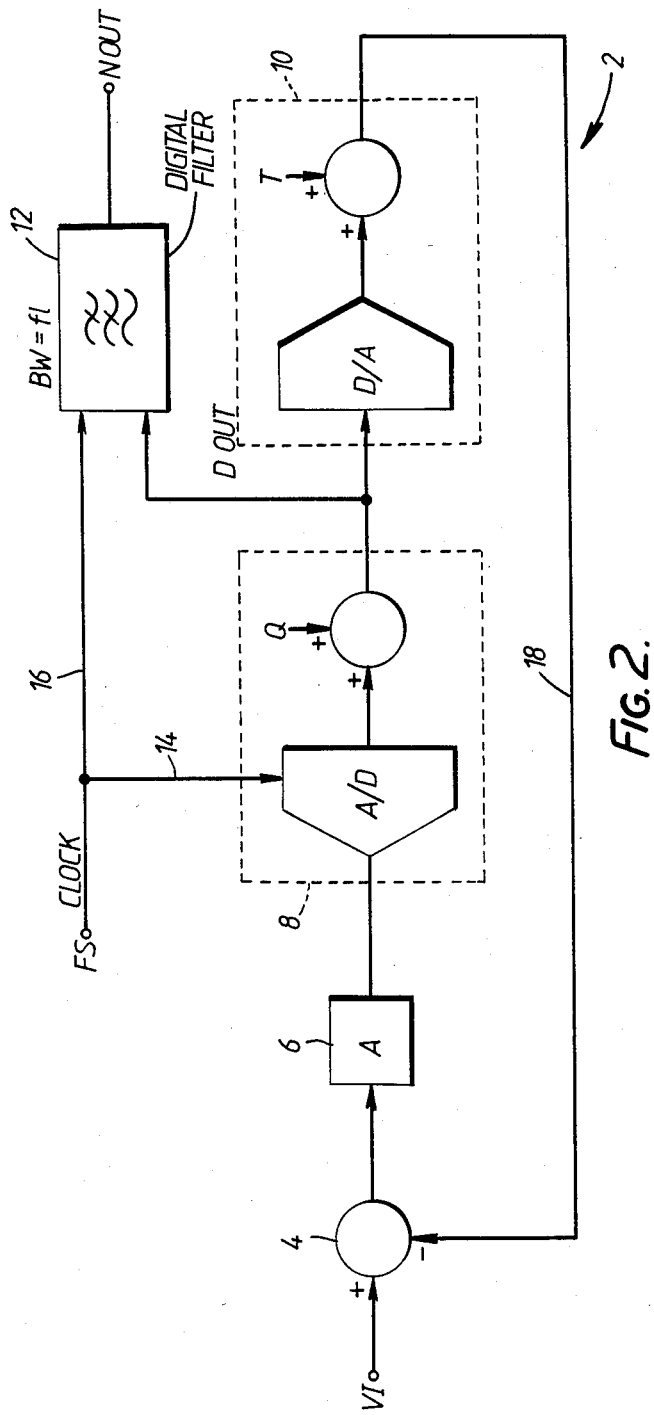
FIG. 2 is a schematic block diagram of the noise model of the analogue to digital converter shown in FIG. 1.

Referring to FIGS. 1 and 2 a known type of interpolating A/D converter 2 comprises a combiner 4 such as a dual input operational amplifier. The output of the combiner 4 is connected via an analogue controller 6 to a coarse flash analogue to digital converter 8 consisting N bits and having a quantisation error Q. The analogue controller 6 is chosen such that its gain is as high as possible whilst maintaining loop stability within the A/D converter 2. The output of the coarse A/D converter 8 is connected to a D/A converter 10 and an output decimation filter 12 of bandwidth F1, the output of which is a digital output signal $N_{OUT}$ representing the amplitude of an analogue input signal $V_I$. The D/A converter 10 is chosen to have far greater resolution than the coarse A/D converter 8 and has errors due to resolution termed T. The resolution T in, for example, resistive ladder type D/A converters can arise from the tolerances of the resistors used in the various levels of the resistive ladder of the converter. A clock is provided (not shown) which provides clock pulses at a clock rate Fs to the coarse A/D converter 8 and the digital filter 12 along lines 14 and 16 respectively. The clock pulses synchronise the operation of the coarse A/D converter 8 and the digital filter 12.

The output of the D/A converter 10 is connected to the combiner 4 by a feedback loop 18 and the resolution of the A/D converter 2 is achieved by means of this feedback arrangement whereby the coarse ouput samples of the coarse A/D converter 8 are forced to interpolate at the high clock rate Fs. However, as described previously, the ultimate resolution of the A/D converter 2 is proportioned to Q/A and in practice is usually less than 14 bits.

The A/D converter in an embodiment of the present invention is based on an oversampling approach with subsequent averaging of the output samples by means of a low pass decimation filter. The resolution is achieved by means of a feedback arrangement whereby the coarse output samples are forced to interpolate at a fast clock rate. The required resolution is obtained by suitable averaging of these output samples.

However, the ultimate two tone dynamic range of the A/D converter is limited by the accuracy of the D/A converter used in its feedback path, whereas the resolution is much greater than this. The interpolating converter uses a digital signal processing approach to the D/A conversion scheme which results in a true range of over 20 bits for the completed converter.

Also, a new type of decimation filter is used which is more efficient than those currently in use, resulting in greater resolution being possible with less hardware.

As described earlier the system output of FIGS. 1 and 2 is:

$$D_{out} = V_1 \cdot A/(1+A) + Q/(1+A) + T \cdot A/(1+A)$$

The unwanted noise components are:

$$Eq = Q/(1+A)$$

and $$Et = T \cdot A/(1+A)$$

It can be seen that Eq is minimised by increasing A, but no amount of loop gain manipulation can reduce Et beyond an improvement due to oversampling in bandwidth F1.

Practically this means that Eq determines the resolution of the interpolating converter while the dynamic range is limited by Et. Most modern D/A converters only have an accuracy of 14 bits maximum so interpolating A/D converters at present can only expect to have a true dynamic range of about 90 dB. This situation is theoretically improved by the use of a one bit converter which replaces both the flash A/D and the D/A converters and results in T being equal to zero. However, Q is now much increased so that the loop gain and clock Fs have to be also increased in order to reduce Eq to an acceptable level. This puts serious limitations on the analogue components which determine A and also requires that a faster and more efficient decimation filter be implemented.

These limitations are overcome by an interpolating D/A converter which has better linearity and higher speed than conventional D/A converters of the resistive ladder or current source type. This D/A conversion scheme is accurate to over 20 bits and is described in U.K. Patent Application No. 8526643 the subject matter of which is incorporated herein by reference.

The main features which make up the design of the A/D converter according to an embodiment of the present invention are as follows:

(1) A Coarse Flash A/D Converter

This is typically a flash A/D Converter which outputs 6 bits at a sample rate of 10 MHz.

(2) A Decimation Filter

Figure 3:
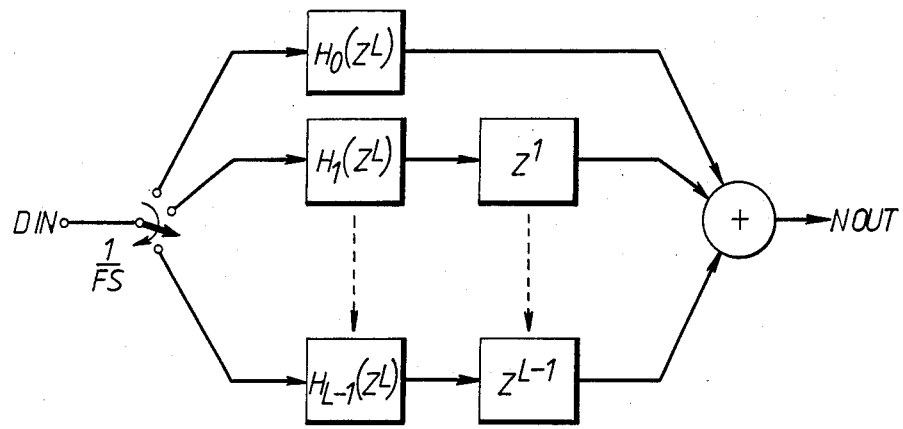
FIG. 3 illustrates a schematic block diagram of a decimation filter employed in an embodiment of the present invention.
Figure 4:
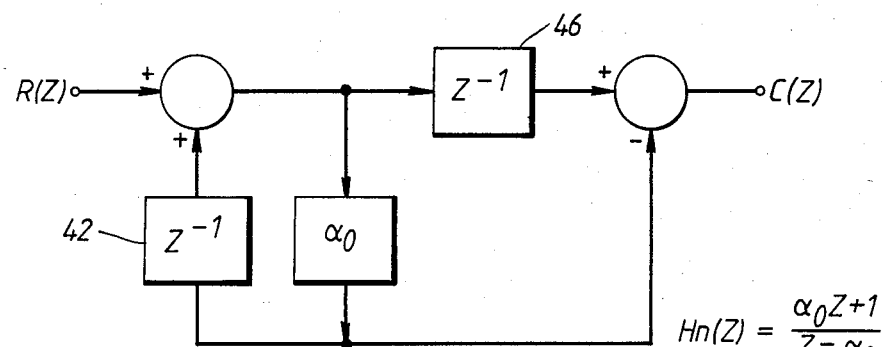
FIG. 4 illustrates in schematic block form an algorithm per arm of the decimation filter shown in FIG. 3.

This filter uses a novel architecture to decimate the output of the coarse A/D converter by a factor of ten to produce a 22 bit word in a 10 KHz bandwidth. Such a filter is shown in FIG. 3 and comprises a plurality of parallel arranged paths, L in number, which during operation are sequentially switched into circuit. Each path comprises a respective filter stage $H_0(Z^L) \ldots H_{L-1}(Z^L)$, and, except for the path having the filter $H_0(Z^L)$, a respective delay stage $Z^1$ to $Z^{L-1}$, arranged in series. The algorithm per path or arm of the filter is shown in FIG. 4 and can be seen to be an all pass network. The blocks 46, 42 represent one bit delays and $a_0$ is the filter coefficient multiplier. Such a decimation scheme provides considerable savings in computations over non recursive schemes meeting the same specifications. Detailed analysis of this method of sample rate reduction is described in detail in an article entitled "Efficient Sample Rate Alteration Using Recursive (IIR) Digital Filters" by R. Ansari and B. Lui published in IEE Transactions Vol ASSP-31 No: 6 December 1983.

(3) A Linear D/A Converter

This is an interpolating system which outputs a bit stream with a mark to space ratio proportional to the input word. This results in a D/A converter which is linear to over 20 bits at a clock rate of 10 MHz in a 10 KHz bandwidth. The detailed description appears in U.K. patent application No. 8526643.

For 21 bits resolution at a clock rate of 10 MHz and a decimation bandwidth of 10 KHz, a type 2, second order controller is preferably required. The basic controller is shown in FIG. 5.

Figure 5:
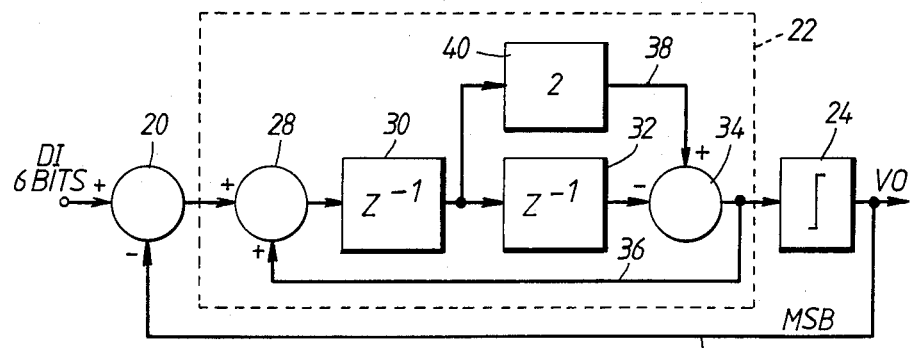
FIG. 5 illustrates a schematic block diagram of a digital to analogue converter employed in an embodiment of the present invention.

Referring to FIG. 5 the D/A converter comprises combiner means 20 which may take the form of an x-bit adder, for receiving a digital input D1. The combiner means 20 is connected to a digital controller 22, the output of which is connected to a one bit quatiser in the form of digital slicer means 24. Feedback means is provided, in the form of a digital feedback control loop 26, between the output of the digital slicer 23 and the combiner means 20. The digital controller 22 comprises summing means 28 in combination with a delay means 30, a second delay means 32, further summing means 34, a feedback loop 36 connecting the output of the further summing means 34 to the summing means 28 and a feed forward loop 38 including a multiplier 40.

The delay means 30, 32 may comprise D-type flip-flops.

(4) Analogue Controller

Figure 6:
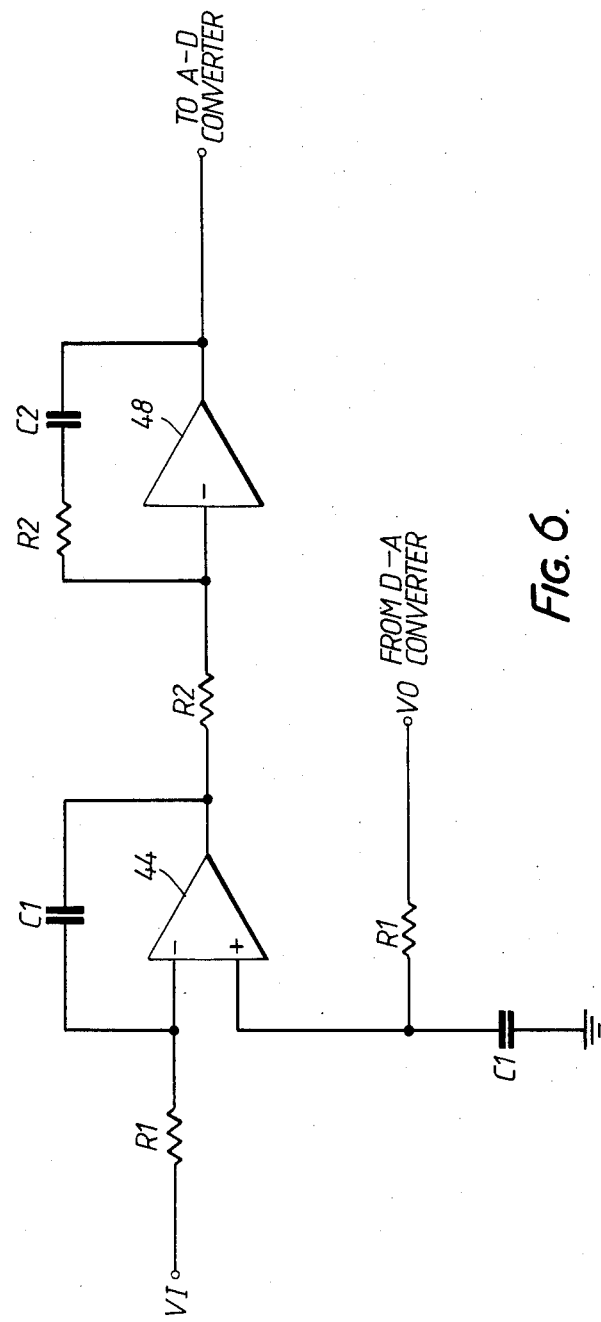
FIG. 6 illustrates an analogue controller employed in an embodiment of the present invention; and, FIG. 7 is a functional block diagram of an analogue to digital converter according to one embodiment of the present invention.

This provides the appropriate loop gain required for the desired system resolution and comprises a pair of operational amplifiers 44, 48 in series arrangement as illustrated in FIG. 6.

Figure 7:
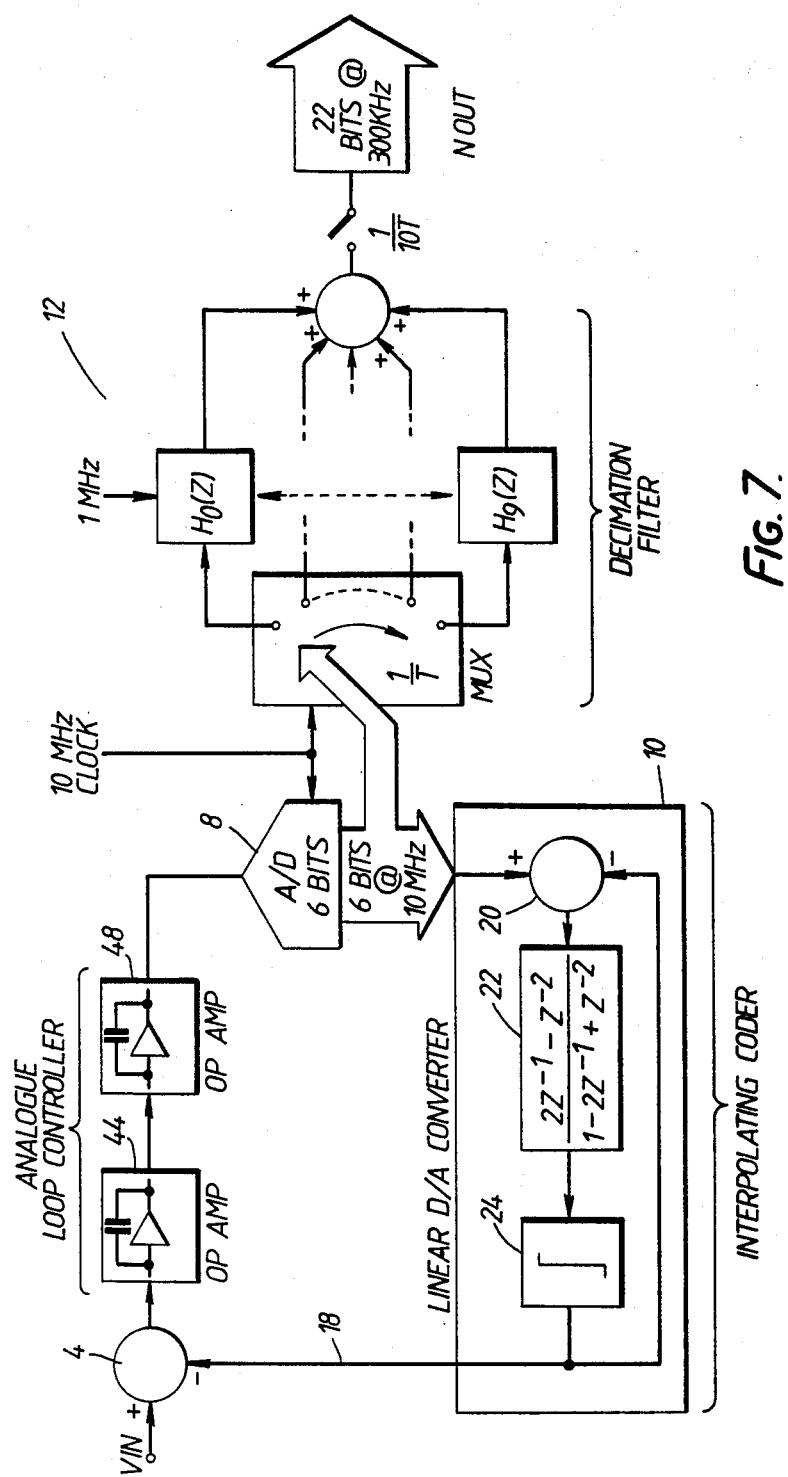

The completed linear Analogue to Digital converter is shown in FIG. 7. The digital to analogue converter 10 in FIG. 7 provides a bit stream along the line 18 having a mark to space ratio proportional to the output word from the low resolution analogue to digital converter 8, which bit stream is subtractively combined at the combining means 4 with the analogue input signal $V_{IN}$. It will be appreciated that if an inverter (not shown) is located in the line 18 then the combining means 4 would need to be modifid to additively combine the bit stream with the analogue signal $V_{IN}$. In one embodiment of the present invention the following specification is achieved:

Dynamic Range: 20 bits
Clock rate: 10 MHz
Output sample rate: 300 KHz
Bandwidth: 10 KHz Although the present invention has been described with respect to a particular embodiment, it should be understood that modifications may be effected within the scope of the invention.

I claim:

1. A high resolution analogue to digital converter comprising combiner means for receiving an analogue input signal, an analogue controller means for receiving an output from the combiner means, a low resolution analogue to digital converter for receiving an output from the analogue controller means, and an interpolating digital to analogue converter arranged in a feedback loop to the combiner means, the interpolating digital to analogue converter comprising a further combiner means for receiving a digital input, digital controller means for receiving an output from the further combiner means, digital slicer means for receiving an output from the digital controller means and feedback means for affording the output of the digital slicer means to the further combiner means, a multi-stage decimation filter coupled to the output of the low resolution analogue to digital converter, the multistage decimation filter having the algorithm of any stage thereof determined in dependence upon the algorithm of the immediately preceding stage.

2. A high resolution analogue to digital converter as claimed in claim 1 wherein the digital controller comprises summing means, first delay means connected to the summing means, second delay means connected to the first delay means, further summing means connected to the second delay means, a feedback loop for affording the output of the further summing means to the summing means, and a feed forward loop, including multiplier means, for affording an output from the first delay means to the further summing means.

3. A high resolution analogue to digital converter as claimed in claim 1 wherein the digital to analogue converter provides a bit stream having a mark to space ratio proportional to the output word from the low resolution analogue to digital converter, which bit stream is subtractively combined with the analogue input signal.

4. A high resolution analogue to digital converter as claimed in claim 1 wherein the digital to analogue converter provides a bit stream having a mark to space ratio proportional to the output word from the low resolution analogue to digital converter, which bit stream is passed via an inverter to the combiner means where it is additively combined with the analogue input signal.

* * * * *